United States Patent
Bokma et al.

(10) Patent No.: US 10,296,136 B2
(45) Date of Patent: *May 21, 2019

(54) TOUCH-SENSITIVE BUTTON WITH TWO LEVELS

(71) Applicant: Apple Inc., Cupertino, CA (US)

(72) Inventors: Louis W. Bokma, San Jose, CA (US); Joseph R. Fisher, Jr., Santa Cruz, CA (US); Saket Vora, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,093

(22) Filed: Feb. 15, 2018

(65) Prior Publication Data

US 2018/0173364 A1 Jun. 21, 2018

Related U.S. Application Data

(63) Continuation of application No. 15/207,234, filed on Jul. 11, 2016, now Pat. No. 9,904,410, which is a (Continued)

(51) Int. Cl.
*G06F 3/041* (2006.01)
*G06F 3/0354* (2013.01)
(Continued)

(52) U.S. Cl.
CPC .......... *G06F 3/0416* (2013.01); *G06F 1/3262* (2013.01); *G06F 3/0202* (2013.01);
(Continued)

(58) Field of Classification Search
CPC ..................................................... G06F 3/0416
(Continued)

(56) References Cited

U.S. PATENT DOCUMENTS 4,188,136 A 2/1980 Bedocs
4,387,367 A 6/1983 Fisher
(Continued)

FOREIGN PATENT DOCUMENTS

CN 1882904 A 12/2006
EP 1 653 338 A1 5/2006
(Continued)

OTHER PUBLICATIONS

Final Office Action dated Apr. 24, 2018, for U.S. Appl. No. 12/333,793, filed Dec. 12, 2008, 21 pages.
(Continued)

*Primary Examiner* — Jason C Olson
(74) *Attorney, Agent, or Firm* — Morrison & Foerster LLP

(57) ABSTRACT

A touch-sensitive depressible button with multiple depression thresholds is provided. When the button is depressed to a first depression threshold, the touch sensor can be switched from a low-power, non-sensing state to a sensing state. When the button is depressed to a second depression threshold, the touch sensor can sense the touch context and input can be generated based on the depression and the touch context. In this way, the touch-sensitive depressible button with multiple depression thresholds can facilitate timely switching of the touch sensor to a sensing state.

18 Claims, 5 Drawing Sheets

Related U.S. Application Data continuation of application No. 14/564,735, filed on Dec. 9, 2014, now Pat. No. 9,400,581, which is a continuation of application No. 14/050,103, filed on Oct. 9, 2013, now Pat. No. 8,933,905, which is a continuation of application No. 13/312,803, filed on Dec. 6, 2011, now Pat. No. 8,581,870.

(51) Int. Cl.
| | | |
|---|---|---|
| *G06F 1/3234* | (2019.01) | |
| *H03K 17/96* | (2006.01) | |
| *G06F 3/02* | (2006.01) | |
| *G06F 3/0338* | (2013.01) | |
| *G06F 3/044* | (2006.01) | |

(52) U.S. Cl.
CPC ........ *G06F 3/0338* (2013.01); *G06F 3/03547* (2013.01); *G06F 3/041* (2013.01); *G06F 3/0414* (2013.01); *H03K 17/962* (2013.01); *G06F 3/044* (2013.01); *G06F 2203/04104* (2013.01); *G06F 2203/04105* (2013.01); *H03K 2017/9615* (2013.01); *H03K 2217/960755* (2013.01)

(58) Field of Classification Search
USPC ......................................................... 345/174
See application file for complete search history.

(56) References Cited

U.S. PATENT DOCUMENTS

| | | | |
|---|---|---|---|
| 4,417,294 A | 11/1983 | Herron, Jr. | |
| 5,189,403 A | 2/1993 | Franz et al. | |
| 5,269,004 A | 12/1993 | Comerford et al. | |
| 5,341,133 A | 8/1994 | Savoy et al. | |
| 5,483,261 A | 1/1996 | Yasutake | |
| 5,488,204 A | 1/1996 | Mead et al. | |
| 5,581,243 A | 12/1996 | Ouellette et al. | |
| 5,675,361 A | 10/1997 | Santilli | |
| 5,707,160 A | 1/1998 | Bowen | |
| 5,736,976 A | 4/1998 | Cheung | |
| 5,745,719 A | 4/1998 | Falcon | |
| 5,821,922 A | 10/1998 | Sellers | |
| 5,825,352 A | 10/1998 | Bisset et al. | |
| 5,835,079 A | 11/1998 | Shieh | |
| 5,880,411 A | 3/1999 | Gillespie et al. | |
| 5,982,302 A | 11/1999 | Ure | |
| 6,188,391 B1 | 2/2001 | Seely et al. | |
| 6,204,839 B1 | 3/2001 | Mato, Jr. | |
| 6,310,610 B1 | 10/2001 | Beaton et al. | |
| 6,323,846 B1 | 11/2001 | Westerman et al. | |
| 6,377,685 B1 | 4/2002 | Krishnan | |
| 6,504,530 B1 | 1/2003 | Wilson et al. | |
| 6,518,958 B1 | 2/2003 | Miyajima et al. | |
| 6,529,186 B1 | 3/2003 | Thayer | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,383,457 B1 | 6/2008 | Knight | |
| 7,428,142 B1 | 9/2008 | Ligtenberg et al. | |
| 7,659,687 B2 | 2/2010 | Larsen et al. | |
| 7,663,607 B2 | 2/2010 | Hotelling et al. | |
| 7,952,038 B1 | 5/2011 | Ando et al. | |
| 7,952,566 B2 | 5/2011 | Poupyrev et al. | |
| 8,479,122 B2 | 7/2013 | Hotelling et al. | |
| 8,581,870 B2 * | 11/2013 | Bokma ............... | G06F 3/03547 200/341 |
| 8,933,905 B2 * | 1/2015 | Bokma ............... | G06F 3/03547 200/341 |
| 9,041,652 B2 | 5/2015 | Elias et al. | |
| 9,400,581 B2 * | 7/2016 | Bokma ............... | G06F 3/03547 |
| 9,454,239 B2 | 9/2016 | Elias | |
| 9,785,251 B2 | 10/2017 | Martisauskas | |
| 9,904,410 B2 * | 2/2018 | Bokma ............... | G06F 3/0416 |
| 2002/0171633 A1 | 11/2002 | Brinjes | |
| 2002/0175901 A1 | 11/2002 | Gettemy | |
| 2003/0025679 A1 | 2/2003 | Taylor et al. | |
| 2003/0201982 A1 | 10/2003 | Iesaka | |
| 2004/0183786 A1 | 9/2004 | Jam | |
| 2005/0174260 A1 | 8/2005 | Arneson et al. | |
| 2005/0262882 A1 | 12/2005 | Moon | |
| 2006/0187212 A1 | 8/2006 | Park et al. | |
| 2006/0197753 A1 | 9/2006 | Hotelling | |
| 2006/0232557 A1 | 10/2006 | Fallot-Burghardt | |
| 2006/0238510 A1 | 10/2006 | Panotopoulos et al. | |
| 2007/0063976 A1 | 3/2007 | Oga | |
| 2007/0120828 A1 | 5/2007 | Fyke | |
| 2007/0146334 A1 | 6/2007 | Inokawa | |
| 2007/0152975 A1 | 7/2007 | Ogihara et al. | |
| 2008/0001787 A1 | 1/2008 | Smith et al. | |
| 2008/0006453 A1 | 1/2008 | Hotelling | |
| 2008/0024459 A1 | 1/2008 | Poupyrev et al. | |
| 2008/0106519 A1 | 5/2008 | Murray | |
| 2008/0158172 A1 | 7/2008 | Hotelling et al. | |
| 2008/0158181 A1 | 7/2008 | Hamblin et al. | |
| 2008/0162996 A1 | 7/2008 | Krah et al. | |
| 2008/0202824 A1 | 8/2008 | Philipp et al. | |
| 2008/0225006 A1 | 9/2008 | Ennadi | |
| 2008/0297475 A1 | 12/2008 | Woolf et al. | |
| 2008/0309522 A1 | 12/2008 | Larsen et al. | |
| 2009/0000936 A1 | 1/2009 | Steijner | |
| 2009/0002199 A1 | 1/2009 | Lainonen et al. | |
| 2009/0027347 A1 | 1/2009 | Wakefield et al. | |
| 2009/0091536 A1 | 4/2009 | Callaghan | |
| 2009/0128503 A1 | 5/2009 | Grant et al. | |
| 2009/0160785 A1 | 6/2009 | Chen et al. | |
| 2009/0210568 A1 | 8/2009 | Peterson et al. | |
| 2009/0314621 A1 | 12/2009 | Hotelling | |
| 2009/0322725 A1 | 12/2009 | David et al. | |
| 2010/0053087 A1 | 3/2010 | Dai et al. | |
| 2010/0059294 A1 | 3/2010 | Elias et al. | |
| 2010/0079309 A1 | 4/2010 | Filson et al. | |
| 2010/0123676 A1 * | 5/2010 | Kirkup ............... | G06F 1/1616 345/174 |
| 2010/0134329 A1 | 6/2010 | Wang et al. | |
| 2010/0148995 A1 | 6/2010 | Elias | |
| 2010/0149108 A1 | 6/2010 | Hotelling et al. | |
| 2010/0177057 A1 | 7/2010 | Flint et al. | |
| 2010/0259482 A1 | 10/2010 | Ball | |
| 2010/0271315 A1 | 10/2010 | Bathiche | |
| 2010/0273534 A1 | 10/2010 | Strom | |
| 2011/0001706 A1 | 1/2011 | Sanford et al. | |
| 2011/0050638 A1 | 3/2011 | Lee | |
| 2011/0141052 A1 | 6/2011 | Bernstein et al. | |
| 2011/0163971 A1 | 7/2011 | Wagner et al. | |
| 2011/0167375 A1 | 7/2011 | Kocienda | |
| 2011/0169765 A1 | 7/2011 | Aono | |
| 2011/0193817 A1 | 8/2011 | Byun et al. | |
| 2011/0227854 A1 | 9/2011 | Koya | |
| 2011/0233041 A1 | 9/2011 | Rajagopal et al. | |
| 2011/0241997 A1 | 10/2011 | Yang | |
| 2011/0267287 A1 | 11/2011 | Bartling et al. | |
| 2012/0032979 A1 | 2/2012 | Blow et al. | |
| 2012/0256839 A1 * | 10/2012 | Suggs ............... | G06F 3/0202 345/168 |
| 2013/0063285 A1 | 3/2013 | Elias | |
| 2013/0063286 A1 | 3/2013 | Elias et al. | |
| 2013/0063356 A1 * | 3/2013 | Martisauskas ....... | G06F 3/016 345/168 |
| 2013/0141342 A1 | 6/2013 | Bokma et al. | |
| 2018/0095545 A1 | 4/2018 | Martisauskas | |

FOREIGN PATENT DOCUMENTS

| | | |
|---|---|---|
| JP | 2000-163031 A | 6/2000 |
| JP | 2002-342033 A | 11/2002 |
| JP | 2010-152671 | 7/2010 |
| JP | 2011/521374 A | 7/2011 |
| KR | 10-0617821 A | 8/2006 |
| KR | 10-2008-0023871 A | 3/2008 |
| KR | 10-2009-0002648 A | 1/2009 |
| TW | 201135568 A | 10/2011 |
| TW | 201142685 A | 12/2011 |

(56) References Cited

FOREIGN PATENT DOCUMENTS

| WO | WO-2011/008861 A1 | 1/2011 |
|---|---|---|
| WO | WO-2011/018439 A1 | 2/2011 |
| WO | WO-2013/039698 A1 | 3/2013 |
| WO | WO-2013/085580 A1 | 6/2013 |

OTHER PUBLICATIONS

Anonymous. (2008). TouchStream LP User Interface Descriptions, located at http://fingerworks.com/ST_product.html, last visited Nov. 13, 2008, 24 pages total (submitted 14 pages). (originally cited as: Fingerworks, TouchStream LP, http://fingerworks.com/ST_product.html).
Chinese Search Report dated Mar. 8, 2016 for CN Application No. 201280057957.9, with English translation, four pages.
European Search Report dated Dec. 8, 2017, for EP Application No. 17201576.0, four pages.
Final Office Action dated Mar. 9, 2012, for U.S. Appl. No. 12/333,793, filed Dec. 12, 2008, 20 pages.
Final Office Action dated Oct. 16, 2012, for U.S. Appl. No. 12/334,320, filed Dec. 12, 2008, 31 pages.
Final Office Action dated Sep. 17, 2013, for U.S. Appl. No. 12/333,793, filed Dec. 12, 2008, 20 pages.
Final Office Action dated Sep. 26, 2013, for U.S. Appl. No. 13/232,968, filed Sep. 14, 2011, 21 pages.
Final Office Action dated Jun. 4, 2014, for U.S. Appl. No. 14/050,103, filed Oct. 9, 2013, 11 pages.
Final Office Action dated Oct. 2, 2014, for U.S. Appl. No. 13/232,968, filed Sep. 14, 2011, 25 pages.
Final Office Action dated Nov. 3, 2014, for U.S. Appl. No. 12/333,793, filed Dec. 12, 2008, 24 pages.
Final Office Action dated Feb. 12, 2015, for U.S. Appl. No. 13/232,941, filed Sep. 14, 2011, 23 pages.
Final Office Action dated Apr. 13, 2017, for U.S. Appl. No. 12/334,320, filed Dec. 12, 2008, 41 pages.
International Search Report dated Dec. 5, 2012, for PCT Application No. PCT/US2012/052929, filed Aug. 29, 2012, four pages.
International Search Report dated Dec. 19, 2012, for PCT Application No. PCT/US2012/053109, filed Aug. 30, 2012, three pages.
International Search Report dated Feb. 5, 2013, for PCT Application No. PCT/US2012/052931, filed on Aug. 29, 2012, six pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Non-Final Office Action dated Oct. 6, 2011, for U.S. Appl. No. 12/333,793, filed Dec. 12, 2008, 16 pages.
Non-Final Office Action dated Apr. 27. 2012, for U.S. Appl. No. 12/334,320, filed Dec. 12, 2008, 25 pages.
Non-Final office Action dated Apr. 15, 2013, for U.S. Appl. No. 12/333,793, filed Dec. 12, 2008, 19 pages.
Non-Final Office Action dated May 9, 2013, for U.S. Appl. No. 13/232,968, filed Sep. 14, 2011, 21 pages.
Non-Final Office Action dated Aug. 14, 2013, for U.S. Appl. No. 12/334/320, filed Dec. 12, 2008, 37 pages.
Non-Final Office Action dated Dec. 13, 2013, for U.S. Appl. No. 14/050,103, filed Oct. 9, 2013, 8 pages.
Non-Final Office Action dated Mar. 10, 2014, for U.S. Appl. No. 13/232,968, filed Sep. 14, 2011, 24 pages.
Non-Final office Action dated May 22, 2014, for U.S. Appl. No. 12/333,793, filed Dec. 12, 2008, 24 pages.
Non-Final Office Action dated Aug. 12, 2014, for U.S. Appl. No. 13/232,955, filed Sep. 14, 2011, eight pages.
Non-Final Office Action dated Sep. 5, 2014, for U.S. Appl. No. 13/232,941, filed Sep. 14, 2011, 14 pages.
Non-Final Office Action dated Sep. 25, 2015, for U.S. Appl. No. 13/232,941, filed Sep. 14, 2011, 14 pages.
Non-Final Office Action dated Sep. 25, 2015, for U.S. Appl. No. 14/564,735, filed Dec. 9, 2014, 15 pages.
Non-Final Office Action dated Feb. 25, 2016, for U.S. Appl. No. 13/232,941, filed Sep. 14, 2011, 17 pages.
Non-Final Office Action dated Aug. 25, 2016, for U.S. Appl. No. 15/207,234, filed Jul. 11, 2016, 21 pages.
Non-Final Office Action dated Sep. 2, 2016, for U.S. Appl. No. 12/334,320, filed Dec. 12, 2008, 38 pages.
Non-Final Office Action dated Apr. 24, 2017, for U.S. Appl. No. 15/207,234, filed Jul. 11, 2016, nine pages.
Non-Final office Action dated Aug. 10, 2017, for U.S. Appl. No. 12/333,793, filed Dec. 12, 2008, 22 pages.
Notice of Allowance dated Jul. 18, 2013, for U.S. Appl. No. 13/312,803, filed Dec. 6, 2011, 8 pages.
Notice of Allowance dated Sep. 10, 2014, for U.S. Appl. No. 14/050,103, filed Oct. 9, 2013, seven pages.
Notice of Allowance dated Jan. 23, 2015, for U.S. Appl. No. 13/232,955, filed Sep. 14, 2011, six pages.
Notice of Allowance dated Mar. 28, 2016, for U.S. Appl. No. 14/564,735, filed Dec. 9, 2014, five pages.
Notice of Allowance dated May 20, 2016, for U.S. Appl. No. 13/232,941, filed Sep. 14, 2011, seven pages.
Notice of Allowance dated Jun. 7, 2017, for U.S. Appl. No. 13/232,968, filed Sep. 14, 2011, eight pages.
Notice of Allowance dated Oct. 25, 2017, for U.S. Appl. No. 15/207,234, filed Jul. 11, 2016, seven pages.
Pash, A. (Nov. 7, 2006). "Hack Attack: Operate Your Mouse with Your Keyboard," *Lifehacker*, located at http://lifehacker.com/software/mouser/hack-attack-operate-your-own-mouse-with-your-keyboard-212816.php, last visited Nov. 10, 2008, seven pages (submitted four pages.).
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
Search Report for ROC (Taiwan) Patent Application No. 101134042, dated Oct. 29, 2013, English Translation, one page.
Westerman, W. (Spring 1999). "Hand Tracking, Finger Identification, and Chordic, Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Non-Final office Action dated Sep. 7, 2018, for U.S. Appl. No. 12/333,793, filed Dec. 12, 2008, 21 pages.
Non-Final office Action dated Oct. 16, 2018, for U.S. Appl. No. 15/727,281, filed Oct. 6, 2017, thirteen pages.

* cited by examiner

TOUCH-SENSITIVE BUTTON WITH TWO LEVELS

CROSS-REFERENCE TO RELATED APPLICATIONS

This application is a Continuation of U.S. patent application Ser. No. 15/207,234, filed Jul. 11, 2016 and published on Nov. 3, 2016 at U.S. Patent Publication No. 2016-0320906, which is a Continuation of U.S. patent application Ser. No. 14/564,735, filed Dec. 9, 2014 and issued on Jul. 26, 2016 as U.S. Pat. No. 9,400,581, which is a Continuation of U.S. patent application Ser. No. 14/050,103 filed Oct. 9, 2013 and issued on Jan. 13, 2015 as U.S. Pat. No. 8,933,905, which is a Continuation of U.S. patent application Ser. No. 13/312,803, filed on Dec. 6, 2011 and issued on Nov. 12, 2013 as U.S. Pat. No. 8,581,870 the contents of which are incorporated herein by reference in their entirety for all purposes.

FIELD OF THE DISCLOSURE

This relates generally to touch-sensitive depressible buttons, and more particularly, to a touch-sensitive mechanical button with multiple depression thresholds.

BACKGROUND OF THE DISCLOSURE

Many types of input devices are available for performing operations in a computing system, such as buttons or keys, mice, trackballs, joysticks, touch sensor panels, touch screens, and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens generally allow a user to perform various functions by touching (e.g., physical contact or near-field proximity) the touch sensor panel using a finger, stylus or other object at a location often dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

A touch sensor panel can be coupled with an actuator to form a depressible button. For example, a trackpad can include a touch sensor panel with a continuous top surface and a portion of the continuous top surface forming a depressible button. In some cases, the touch sensing functionality may only be used to determine the touch context when the button is depressed. However, frequently scanning the touch sensor for touch events when the button is not depressed can be an inefficient use of power, especially in mobile devices running on battery power.

SUMMARY OF THE DISCLOSURE

This relates to a touch-sensitive depressible button with multiple depression thresholds. A touch-sensitive depressible button can generate input based on a depression of the button or based on a touch event performed on a surface of the button. Additionally, the button can generate input based on both the depression and the touch event. For example, a button might generate a first input when it is depressed by a finger on a left portion of the surface of the button and a second input when it is depressed by a finger on a right portion of the surface of the button. In this way, a single depressible button can serve multiple functions depending on where it is depressed.

In some embodiments, a touch-sensitive depressible button can only generate input when the button is depressed. Touch events might not be accepted when the button is not depressed. In such a case, the button's touch sensor can be kept in a low power, non-sensing state until the button is depressed, at which point the touch sensor can be switched to a sensing state to provide a touch context for the depression. Conserving power can be especially important in battery-powered devices such as mobile phones. However, the process of switching to a sensing state might take an amount of time too large to provide an immediate touch context for the depression of the button.

Accordingly, a touch-sensitive depressible button can have multiple depression thresholds to facilitate timely switching of the touch sensor to a sensing state. The button can be depressed from an initial position to a first depression threshold and from the first depression threshold to a second depression threshold. When the button is depressed to the first depression threshold, the touch sensor can be switched from a low-power, non-sensing state to a sensing state. When the button is depressed to the second depression threshold, the touch sensor can sense the touch context and input can be generated based on the depression and the touch context. In some embodiments, the distance from the initial position to the first depression threshold can be so small so as to be imperceptible to a user. Additionally, in some embodiments the distance from the initial position to the second depression threshold can be large enough to be perceived by the user as a complete button depression.

In this way, the touch-sensitive depressible button with multiple depression thresholds can facilitate timely switching of the touch sensor to a sensing state. Additionally, a touch sensing process can have more time to accurately determine the touch context. For example, a touch sensor might switch to a sensing state before the button has been depressed to the second depression threshold. In such a case, the remaining time before the button is depressed to the second depression threshold can be used to begin determining the touch context in advance. Furthermore, the touch sensing process of the depressible button can be initiated by the user, thereby providing a more immediate touch context than with a continual touch sensing process, which can be asynchronous to user contact.

DETAILED DESCRIPTION

Figure 1A:
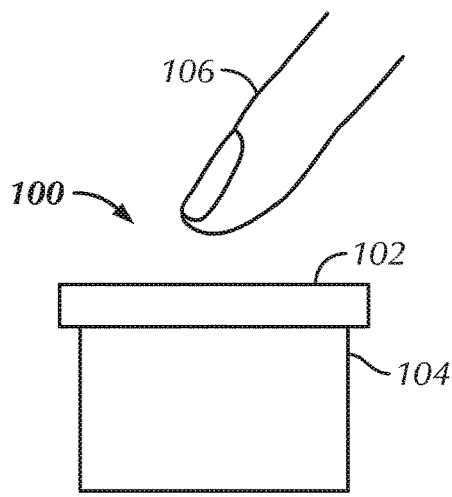
FIG. 1A illustrates an exemplary touch-sensitive depressible button at an initial depression position according to embodiments of the disclosure.

In the following description of embodiments, reference is made to the accompanying drawings which form a part hereof, and in which it is shown by way of illustration specific embodiments that can be practiced. It is to be understood that other embodiments can be used and structural changes can be made without departing from the scope of the disclosed embodiments.

Various embodiments relate to a touch-sensitive depressible button with multiple depression thresholds. A touch-sensitive depressible button can generate input based on a depression of the button or based on a touch event performed on a surface of the button. Additionally, the button can generate input based on both the depression and the touch event. For example, a button might generate a first input when it is depressed by a finger on a left portion of the surface of the button and a second input when it is depressed by a finger on a right portion of the surface of the button. In this way, a single depressible button can serve multiple functions depending on where it is depressed.

In some embodiments, a touch-sensitive depressible button can only generate input when the button is depressed. Touch events might not be accepted when the button is not depressed. In such a case, the button's touch sensor can be kept in a low power, non-sensing state until the button is depressed, at which point the touch sensor can be switched to a sensing state to provide a touch context for the depression. Conserving power can be especially important in battery-powered devices such as mobile phones. However, the process of switching to a sensing state might take an amount of time too large to provide an immediate touch context for the depression of the button.

Accordingly, a touch-sensitive depressible button can have multiple depression thresholds to facilitate timely switching of the touch sensor to a sensing state. The button can be depressed from an initial position to a first depression threshold and from the first depression threshold to a second depression threshold. When the button is depressed to the first depression threshold, the touch sensor can be switched from a low-power, non-sensing state to a sensing state. When the button is depressed to the second depression threshold, the touch sensor can sense the touch context and input can be generated based on the depression and the touch context. In some embodiments, the distance from the initial position to the first depression threshold can be so small so as to be imperceptible to a user. Additionally, in some embodiments the distance from the initial position to the second depression threshold can be large enough to be perceived by the user as a complete button depression.

In this way, the touch-sensitive depressible button with multiple depression thresholds can facilitate timely switching of the touch sensor to a sensing state. Additionally, a touch sensing process can have more time to accurately determine the touch context. For example, a touch sensor might switch to a sensing state before the button has been depressed to the second depression threshold. In such a case, the remaining time before the button is depressed to the second depression threshold can be used to begin determining the touch context in advance. Furthermore, the touch sensing process of the depressible button can be initiated by the user, thereby providing a more immediate touch context than with a continual touch sensing process, which can be asynchronous to user contact.

Although embodiments disclosed herein may be described and illustrated herein primarily in terms of mutual capacitance touch sensor panels, it should be understood that the embodiments are not so limited, but are additionally applicable to self-capacitance sensor panels, and both single and multi-touch sensor panels. Although embodiments disclosed herein may be described and illustrated herein in terms of touch sensor panels without a coupled display device, it should be understood that embodiments are not so limited, but are additionally applicable to touch sensor panels coupled with a display device.

Figure 1B:
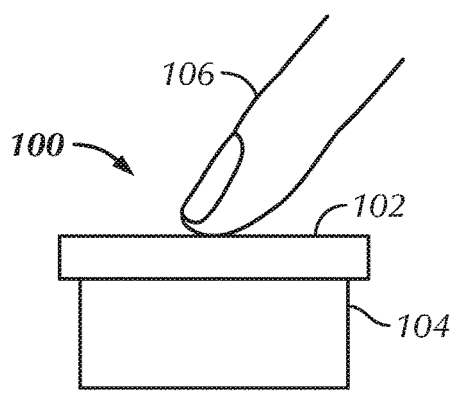
FIG. 1B illustrates an exemplary touch-sensitive depressible button at a first depression threshold according to embodiments of the disclosure.
Figure 1C:
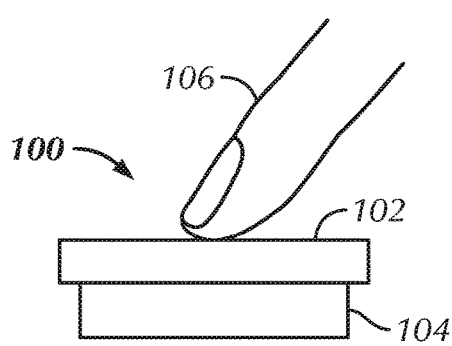
FIG. 1C illustrates an exemplary touch-sensitive depressible button at a second depression threshold according to embodiments of the disclosure.

FIGS. 1A-C illustrate an exemplary touch-sensitive depressible button 100 according to embodiments of the disclosure. The button 100 comprises a touch sensor 102 coupled to a depressible actuator 104.

FIG. 1A illustrates an exemplary touch-sensitive depressible button 100 at an initial depression position according to embodiments of the disclosure. When the button 100 is at the initial depression position, the touch sensor 102 can be in a low-power, non-sensing state.

FIG. 1B illustrates an exemplary touch-sensitive depressible button 100 at a first depression threshold according to embodiments of the disclosure. A touch object 106, such as a finger or a stylus, can depress the button 100 by exerting force on a top surface of the touch sensor 102, which can cause the actuator 104 to depress or generally change its state or configuration. When the button 100 reaches the first depression threshold, the touch sensor 102 can switch from the low-power, non-sensing state to a sensing state.

FIG. 1C illustrates an exemplary touch-sensitive depressible button 100 at a second depression threshold according to embodiments of the disclosure. Touch object 106 can further depress the button 100 by exerting force on the top surface of the touch sensor 102, further causing the actuator 104 to depress or generally change its state or configuration. When the button 100 reaches the second depression threshold, the touch sensor 102 can determine a touch context of the touch object 106 based on detection of various touch events. For example, the touch sensor 102 can determine the location of the touch object 106 on the top surface of the touch sensor. Additionally, the touch sensor 102 can determine a motion of the touch object 106 along its surface. In some embodiments, the touch context can include at least a position, a velocity, or a gesture, for example. The touch context can also include a touchdown time (e.g., a time when a touch object makes contact with the top surface of the touch sensor), or an elapsed time between the moment the button 100 reaches the first depression threshold and the moment the button reaches the second depression threshold. In other embodiments, the touch context can include the shape of the contact(s) on the touch sensor and/or an identification of the touch objects (e.g., an identification of a particular finger or thumb).

The distance from the initial depression position to the first depression threshold can, in some embodiments, be so small so as to be imperceptible to a user. Additionally, the first depression threshold can be a hair-trigger, wherein even the slightest touch of the top surface of the touch sensor 102 can cause the button 100 to reach the first depression threshold. For example, the hair-trigger can be any detected depression as compared to a no-touch, no-depression steady-state. The distance from the initial depression position to the second depression threshold can, in some embodiments, be large enough to be perceived by the user as a complete button depression.

Figure 2:
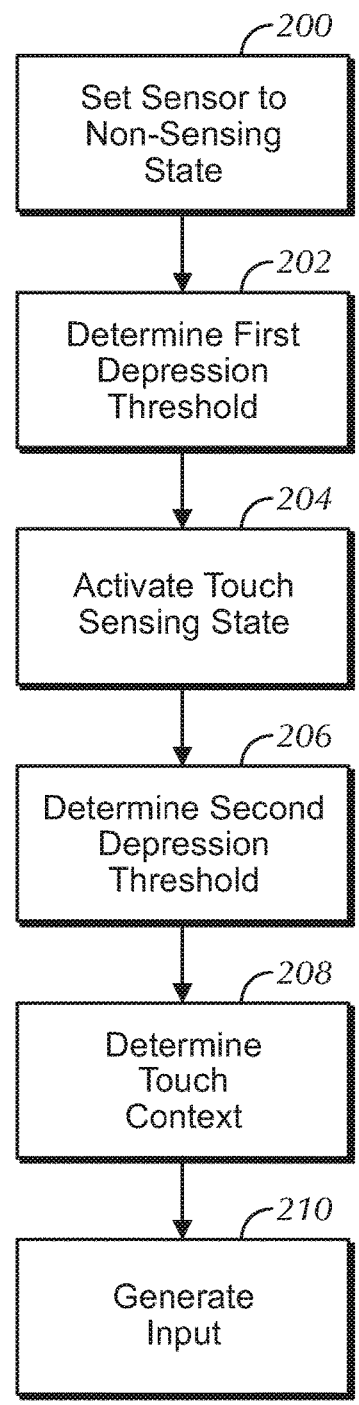
FIG. 2 is a high-level flow diagram illustrating an exemplary method of generating input from a touch-sensitive depressible button according to embodiments of the disclosure.

FIG. 2 is a high-level flow diagram illustrating an exemplary method of generating input from a touch-sensitive depressible button according to embodiments of the disclosure. At block 200, a touch sensor of the button can be set to a non-sensing state. In some embodiments, the touch sensor in the non-sensing state can consume no power. Alternatively, the touch sensor in the non-sensing state can consume a small amount of power to enable a shorter wake up time, wherein the wake up time is the time it takes to switch to a touch sensing state. In some embodiments, the touch sensor in the non-sensing state can wake up occasionally (e.g., once every second) to sense an environmental baseline for calibration purposes and then immediately thereafter resume the non-sensing state. In other embodiments, the touch sensor in the non-sensing state can wake up more frequently or less frequently.

At block 202, it can be determined that the button has been depressed to a first depression threshold. Depression thresholds can be determined differently according to various embodiments. As discussed below, depression thresholds can be determined by a double-dome actuator or a self-capacitive actuator, among other embodiments. In some embodiments, upon depression to the first depression threshold, a first depression threshold time can be determined. The first depression threshold time can be used later to determine a touch context.

At block 204, the touch sensor can be switched from the non-sensing state to a touch sensing state. The touch sensor in the touch sensing state can, in some embodiments, idly scan to detect touch events or actively scan to detect touch events. In one example, an idle scan rate can be in the range of 10 Hz to 30 Hz, and an active scan rate can be in the range of 60 Hz to 125 Hz. Other embodiments may actively or idly scan at different rates. As discussed above, in some embodiments, the touch sensor in the non-sensing state may already be powered on. Accordingly, the touch sensor can be switched to the touch sensing state merely by initiating the idle scanning process or the active scanning process.

In some embodiments, the touch sensor in the touch sensing state can scan once to detect touch events. For example, the touch sensor may scan once to determine a position of any touch objects on the surface of the touch sensor. In such a case, the touch sensor can be switched to the touch sensing state merely by initiating a single scan.

At block 206, it can be determined that the button has been depressed to a second depression threshold. Depression thresholds can be determined differently according to various embodiments. As discussed below, depression thresholds can be determined by a double-dome actuator or a self-capacitive actuator, among other embodiments. In some embodiments, upon depression to the second depression threshold, a second depression threshold time can be determined. The second depression threshold time can be used later to determine a touch context.

At block 208, the touch context can be determined based on touch events detected during scans of the touch sensor. The touch context can include positions of any touch objects on the surface of the touch sensor. Additionally, the touch context can include motion of the touch objects, including velocities and gestures. The touch context can also include a touchdown time (e.g., a time when a touch object makes contact with the top surface of the touch sensor), or an elapsed time between the first depression threshold time and the second depression threshold time. In other embodiments, the touch context can include the shape of the contact(s) on the touch sensor and/or an identification of the touch objects (e.g., an identification of a particular finger or thumb).

At block 210, input can be generated based on the touch context and the determination that the button has been depressed to a second depression threshold. According to some embodiments, generating input can include the generation of a control signal. Such a control signal can be sent to a connected computing system, causing the computing system to execute a command associated with the control signal. For example, based on the touch context, a control signal might be sent to the computing system, causing the computing system to adjust a volume level, initiate an application, or move a cursor.

Figure 3:
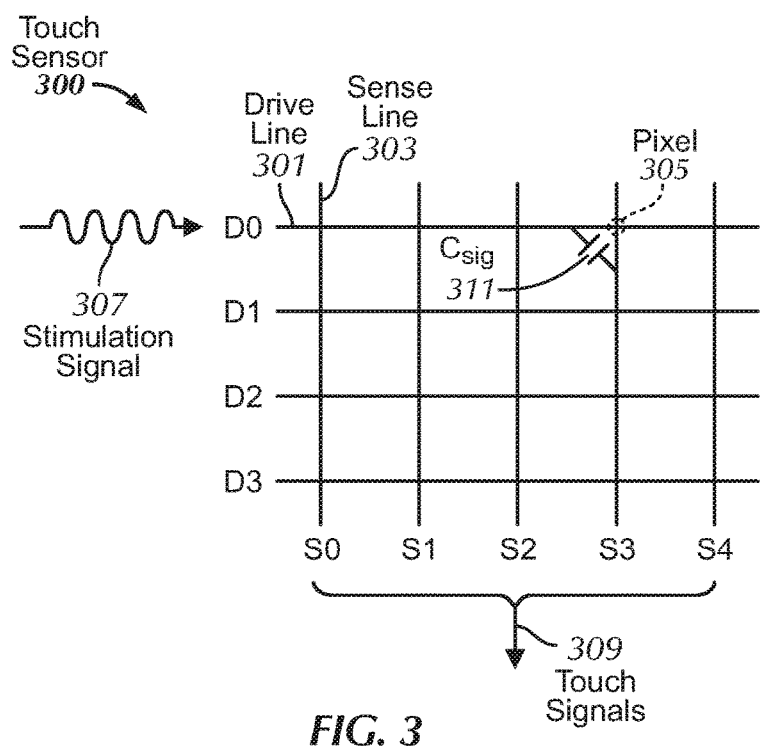
FIG. 3 illustrates a portion of an exemplary touch sensor that can be used to detect touch events and determine a touch context on the touch-sensitive depressible button according to embodiments of the disclosure.

FIG. 3 illustrates a portion of an exemplary touch sensor 300 that can be used to detect touch events and determine a touch context on the touch-sensitive depressible button 100 according to embodiments of the disclosure. Touch sensor 300 can include an array of pixels 305 that can be formed at the crossing points between rows of drive lines 301 (D0-D3) and columns of sense lines 303 (S0-S4). Each pixel 305 can have an associated mutual capacitance Csig 311 formed between the crossing drive lines 301 and sense lines 303 when the drive lines are stimulated. The drive lines 301 can be stimulated by stimulation signals 307 provided by drive circuitry (not shown) and can include an alternating current (AC) waveform. The sense lines 303 can transmit touch or sense signals 309 indicative of a touch at the panel 300 to sense circuitry (not shown), which can include a sense amplifier for each sense line.

To sense a touch at the touch sensor 300, drive lines 301 can be stimulated by the stimulation signals 307 to capacitively couple with the crossing sense lines 303, thereby forming a capacitive path for coupling charge from the drive lines 301 to the sense lines 303. The crossing sense lines 303 can output touch signals 309, representing the coupled charge or current. When a user's finger (or other object) touches the panel 300, the finger can cause the capacitance Csig 311 to reduce by an amount ΔCsig at the touch location. This capacitance change ΔCsig can be caused by charge or current from the stimulated drive line 301 being shunted through the touching finger to ground rather than being coupled to the crossing sense line 303 at the touch location. The touch signals 309 representative of the capacitance change ΔCsig can be transmitted by the sense lines 303 to the sense circuitry for processing. The touch signals 309 can indicate the pixel where the touch occurred and the amount of touch that occurred at that pixel location.

While the embodiment shown in FIG. 3 includes four drive lines 301 and five sense lines 303, it should be appreciated that touch sensor 300 can include any number of drive lines 301 and any number of sense lines 303 to form the desired number and pattern of pixels 305. Additionally, while the drive lines 301 and sense lines 303 are shown in FIG. 3 in a crossing configuration, it should be appreciated that other configurations are also possible to form the desired pixel pattern. While FIG. 3 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 300 can also sense a hovering object and generate hover signals therefrom.

Figure 4A:
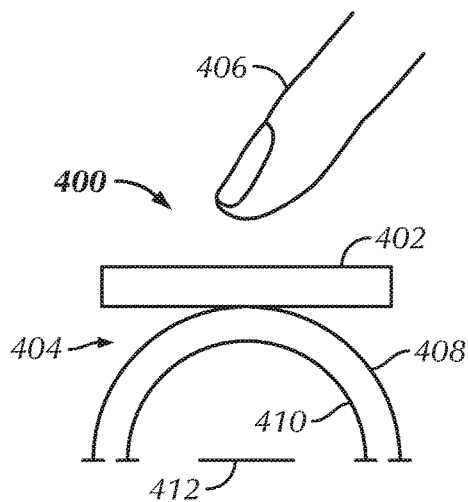
FIG. 4A illustrates an exemplary touch-sensitive depressible button with a double-dome actuator at an initial depression position according to embodiments of the disclosure.
Figure 4B:
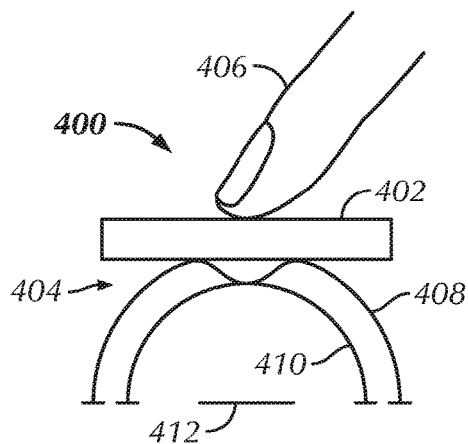
FIG. 4B illustrates an exemplary touch-sensitive depressible button with a double-dome actuator at a first depression threshold according to embodiments of the disclosure.
Figure 4C:
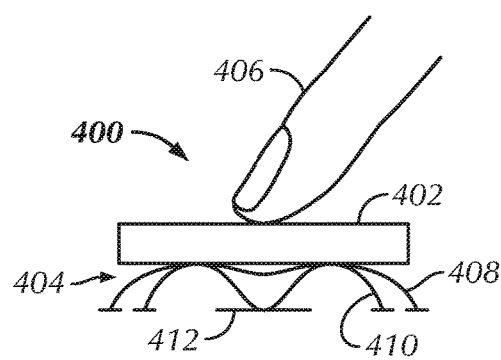
FIG. 4C illustrates an exemplary touch-sensitive depressible button with a double-dome actuator at a second depression threshold according to embodiments of the disclosure.

FIGS. 4A-C illustrate an exemplary touch-sensitive depressible button 400 with a double-dome actuator 404 according to embodiments of the disclosure. The double-dome actuator 404 can include a first deformable electrode dome 408, a second deformable electrode dome 410, and a first electrode 412. The first and second electrode domes can each be coupled to a microcontroller for detecting when the first electrode dome 408 contacts the second electrode dome 410 and further for detecting when the second electrode dome contacts the first electrode 412. Additionally, the first electrode 412 can be coupled to a microcontroller.

FIG. 4A illustrates an exemplary touch-sensitive depressible button 400 with a double-dome actuator 404 at an initial depression position according to embodiments of the disclosure.

FIG. 4B illustrates an exemplary touch-sensitive depressible button 400 with a double-dome actuator 404 at a first depression threshold according to embodiments of the disclosure. The force applied to the touch sensor 402 can cause the first deformable electrode dome 408 to deform and contact the second deformable electrode dome 410. Contact between the first and second electrode domes can indicate that the first depression threshold has been reached.

FIG. 4C illustrates an exemplary touch-sensitive depressible button 400 with a double-dome actuator 404 at a second depression threshold according to embodiments of the disclosure. The force applied to the touch sensor 402 can cause the first deformable electrode dome 408 to contact and exert force on the second deformable electrode dome 410. This can cause the second electrode dome 410 to deform and contact the first electrode 412. Contact between the second electrode dome 410 and the first electrode 412 can indicate that the second depression threshold has been reached. In some embodiments, an electric potential applied to the first and second electrode domes and the first electrode, and/or the electrical resistance of the material comprising the domes, can enable detection circuitry (not shown) to detect contact between the first and second domes, or contact between the second dome and the first electrode.

According to various embodiments, the first and second depression thresholds can be determined by the shape and composition of each deformable electrode dome. For example, the height difference between the first and second electrode domes can determine the distance from the initial position to the first depression threshold. Additionally, the height of the second electrode dome can determine the distance from the first depression threshold to the second depression threshold. In some embodiments, the force required to reach each of the first and second depression thresholds can be determined by the composition, thickness and deformation resistance of each of the first and second electrode domes. For example, a first electrode dome with a low resistance to deformation may require only a small amount of force to reach the first depression threshold. In contrast, a second electrode dome with a higher resistance to deformation may require a larger amount of force to reach the second depression threshold.

Figure 5A:
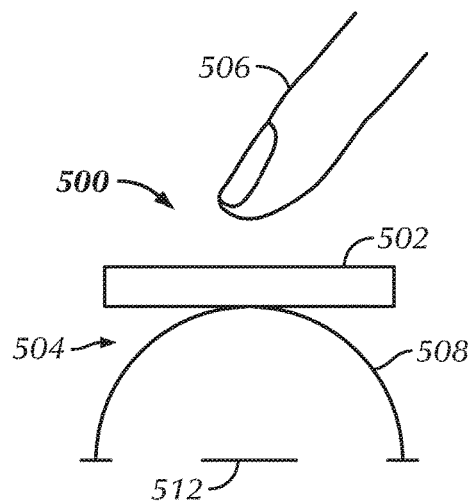
FIG. 5A illustrates an exemplary touch-sensitive depressible button with a self-capacitive actuator at an initial depression position according to embodiments of the disclosure.
Figure 5B:
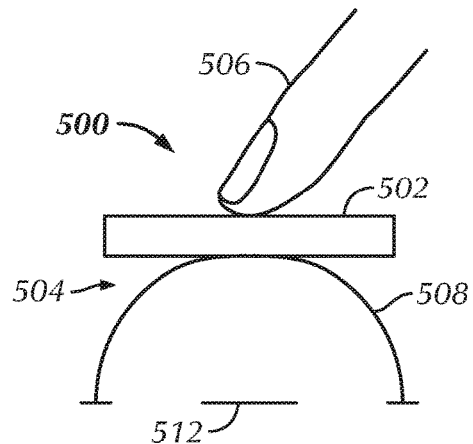
FIG. 5B illustrates an exemplary touch-sensitive depressible button with a self-capacitive actuator at a first depression threshold according to embodiments of the disclosure.
Figure 5C:
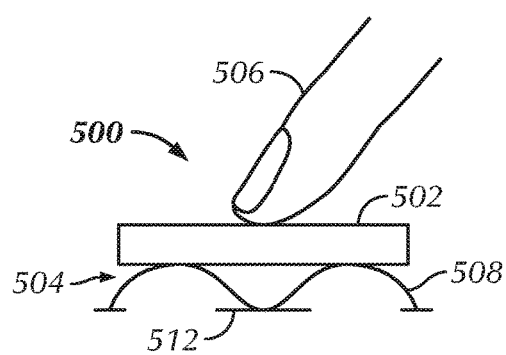
FIG. 5C illustrates an exemplary touch-sensitive depressible button with a self-capacitive actuator at a second depression threshold according to embodiments of the disclosure.

FIGS. 5A-C illustrate an exemplary touch-sensitive depressible button 500 with a self-capacitive actuator 504 according to embodiments of the disclosure. The self-capacitive actuator 504 comprises a self-capacitive deformable electrode dome 508, and a first electrode 512. The self-capacitive deformable electrode dome 508 can be coupled to a microcontroller for detecting changes in the self-capacitance of the electrode dome with respect to the first electrode 512 as the dome approaches the electrode, and further for detecting when the electrode dome contacts the first electrode 512. Additionally, the first electrode 512 can be coupled to a microcontroller.

FIG. 5A illustrates an exemplary touch-sensitive depressible button 500 with a self-capacitive actuator 504 at an initial depression position according to embodiments of the disclosure.

FIG. 5B illustrates an exemplary touch-sensitive depressible button 500 with a self-capacitive actuator 504 at a first depression threshold according to embodiments of the disclosure. The self-capacitive deformable electrode dome 508 can have a self-capacitance to ground that can be changed by the proximate presence of the touch object 506. The change in capacitance can indicate that the first depression threshold has been reached.

FIG. 5C illustrates an exemplary touch-sensitive depressible button 500 with a self-capacitive actuator 504 at a second depression threshold according to embodiments of the disclosure. The force applied to the touch sensor 502 can cause the self-capacitive deformable electrode dome 508 to contact the first electrode 512. Contact between the electrode dome 508 and the first electrode 512 can indicate that the second depression threshold has been reached.

In some embodiments, alternate structures can be employed to detect that the first and second depression thresholds have been reached. For example, an accelerometer sensing vibration from a touch object can detect that a first depression threshold has been reached, and a simple dome-switch can detect that a second depression threshold has been reached. Alternatively, a force sensing resistive sheet can detect that a first depression threshold has been reached, and again a simple dome-switch can detect that a second depression threshold has been reached. In still further embodiments, multiple force sensing resistive sheets can be utilized for multiple depression thresholds. It should also be understood that although the embodiments disclosed herein describe and illustrate only two depression thresholds, more than two depression thresholds are also contemplated using additional structures.

A touch-sensitive depressible button as described above can generate input based on a depression of the button or based on a touch event or gesture performed on a surface of the button. Additionally, the button can generate input based on both the depression and the touch event. For example, a button might generate a first input when it is depressed by a finger on a left portion of the surface of the button and a second input when it is depressed by a finger on a right portion of the surface of the button. In this way, a single depressible button can serve multiple functions depending on where it is depressed. In addition, the touch-sensitive depressible button can detect multiple depression thresholds and utilize this additional information to perform additional functions, such as switching between various power states or providing a z-axis input in addition to x and y axis input.

Figure 6:
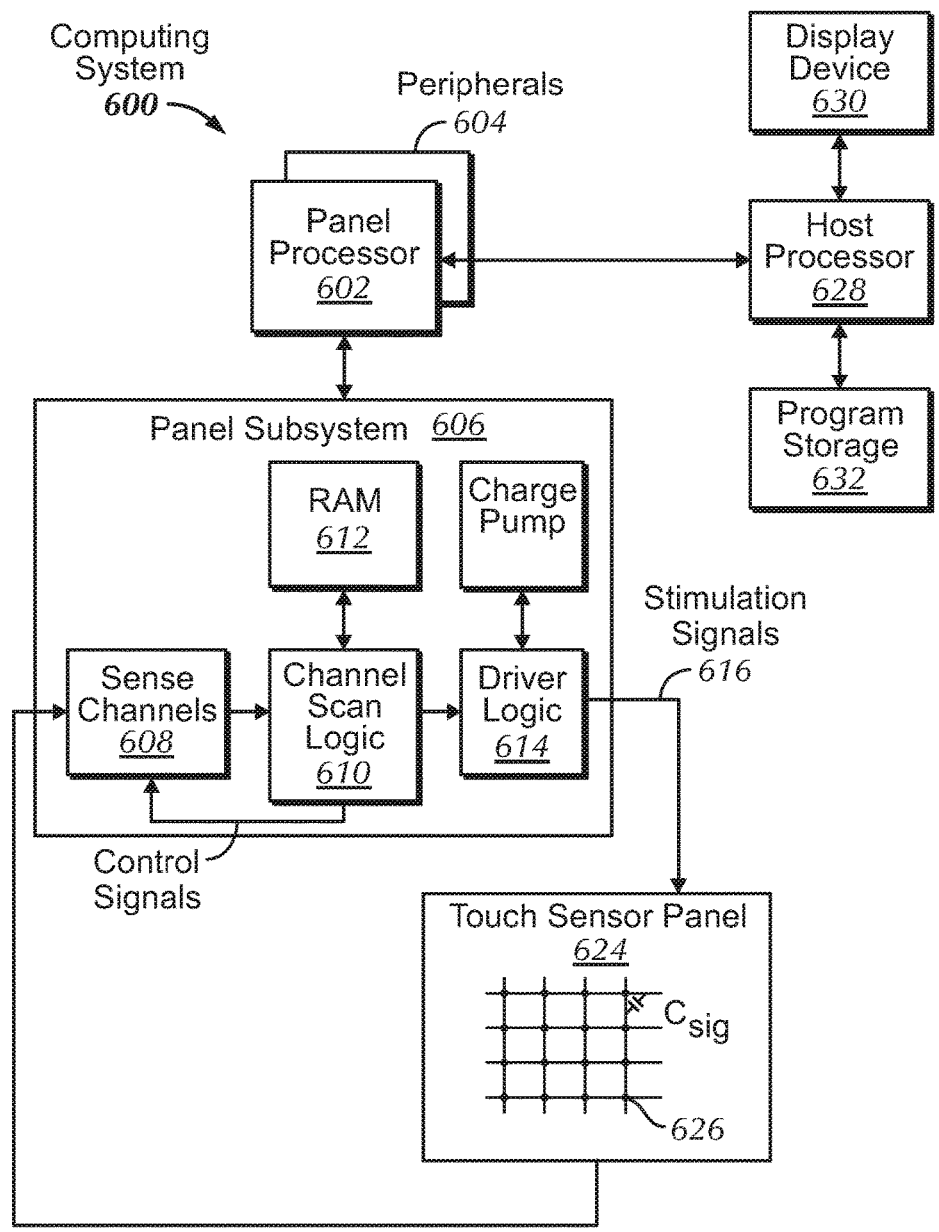
FIG. 6 illustrates an exemplary computing system that can include a touch sensor panel coupled to an actuator to form a touch-sensitive depressible button according to embodiments of the disclosure.

FIG. 6 illustrates exemplary computing system 600 that can include a touch sensor panel 624 coupled to an actuator to form a touch-sensitive depressible button as in one or more of the embodiments described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be coupled to program storage 632 and display device 630 such as an LCD display for providing a UI to a user of the device. Display device 630 together with touch sensor panel 624, when located partially or entirely under the touch sensor panel, can form touch screen 618. Touch screen 618 coupled to an actuator can form a touch-sensitive depressible button as in one or more of the embodiments described above.

Note that one or more of the functions described above, can be performed, for example, by firmware stored in memory (e.g., one of the peripherals) and executed by the panel processor 602, or stored in the program storage 632 and executed by the host processor 628. The firmware can also be stored and/or transported within any computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 7A:
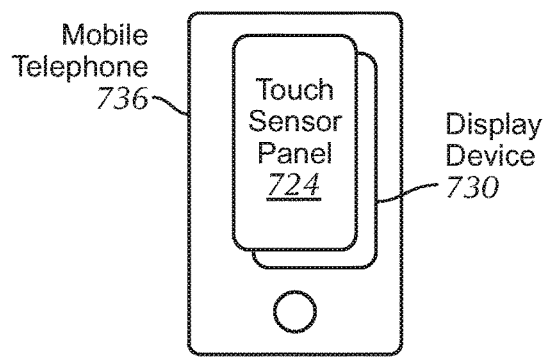
FIG. 7A illustrates an exemplary mobile telephone that can include a touch sensor panel and a display device, the touch sensor panel coupled to an actuator to form a touch-sensitive depressible button according to embodiments of the disclosure.

FIG. 7A illustrates exemplary mobile telephone 736 that can include touch sensor panel 724 and display device 730, the touch sensor panel coupled to an actuator to form a touch-sensitive depressible button as in one or more of the embodiments described above.

Figure 7B:
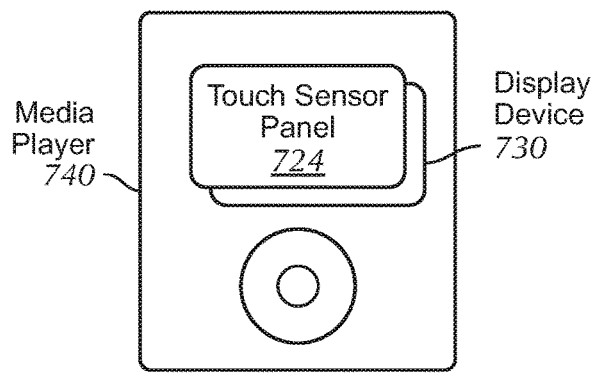
FIG. 7B illustrates an exemplary digital media player that can include a touch sensor panel and a display device, the touch sensor panel coupled to an actuator to form a touch-sensitive depressible button according to embodiments of the disclosure.

FIG. 7B illustrates exemplary digital media player 740 that can include touch sensor panel 724 and display device 730, the touch sensor panel coupled to an actuator to form a touch-sensitive depressible button as in one or more of the embodiments described above.

Figure 7C:
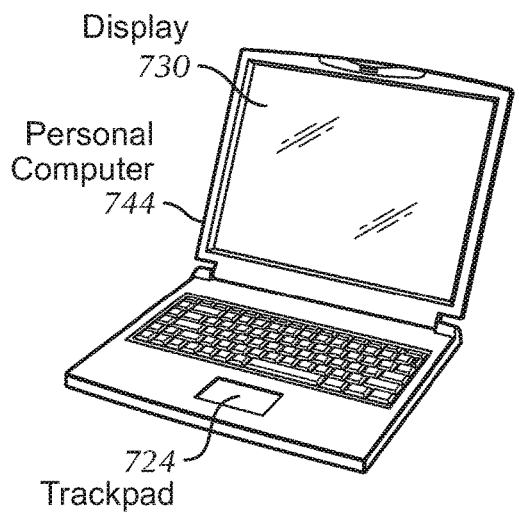
FIG. 7C illustrates an exemplary personal computer that can include a touch sensor panel (trackpad) and a display, the touch sensor panel and/or display of the personal computer coupled to an actuator to form a touch-sensitive depressible button according to embodiments of the disclosure.

FIG. 7C illustrates exemplary personal computer 744 that can include touch sensor panel (trackpad) 724 and display 730, the touch sensor panel and/or display of the personal computer (in embodiments where the display is part of a touch screen) coupled to an actuator to form a touch-sensitive depressible button as in one or more of the embodiments described above.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

What is claimed is:

1. A system including a touch sensitive button, the touch sensitive button comprising:
   a touch sensor array for detecting input events; and
   an actuator coupled with the touch sensor array;
   the system including a controller communicatively coupled to the touch sensor array and the actuator, the controller configured for
      placing the touch sensor array in a low-power state when no touch of the button is detected by the actuator;
      switching the touch sensor array from the low-power state to an active scan state when a touch of the button is detected by the actuator; and
      receiving a touch signal from the touch sensitive button indicative of an amount of pressure applied to the touch sensor array, and generating a control signal when a pressure threshold is exceeded.

2. The system of claim 1, wherein the actuator comprises an electrode, the electrode configured for changing at least one parameter when an object touches the button.

3. The system of claim 1, wherein the actuator comprises a self-capacitive actuator configured for changing its self-capacitance to ground when an object touches the button.

4. The system of claim 1, further comprising a dome switch for detecting when an amount of pressure exceeding the pressure threshold is being applied to the touch sensor array.

5. The system of claim 1, the controller further configured for scanning the touch sensor array to detect one or more touches of one or more objects when the touch sensor array is switched to the active scan state.

6. The system of claim 5, the controller further configured for performing a series of scans of the touch sensor array to detect one or more positions of the one or more touches.

7. The system of claim 5, the controller further configured for detecting a shape of the one or more touches.

8. The system of claim 5, the controller further configured for performing an identification of the one or more objects.

9. A method for generating input from a touch sensitive button, comprising:
   placing a touch sensor array in a low-power state when no touch of the button is detected by an actuator;
   switching the touch sensor array from the low-power state to an active scan state when a touch of the button is detected by the actuator;
   detecting input events at the touch sensor array when the touch sensor array is switched to the active scan state;
   identifying an object touching the button; and
   generating a control signal when a pressure threshold is exceeded.

10. The method of claim 9, wherein the actuator comprises an electrode, the method further comprising changing at least one parameter of the electrode and detecting the change in the at least one parameter when an object touches the button.

11. The method of claim 9, wherein the actuator comprises a self-capacitive actuator, the method further comprising changing a self-capacitance to ground of the actuator and detecting the change in the self-capacitance when an object touches the button.

12. The method of claim 9, further comprising initiating an operation when the control signal is generated.

13. The method of claim 9, further comprising scanning the touch sensor array to detect one or more touches causing the input events when the touch sensor array is switched to the active scan state.

14. The method of claim 13, further comprising performing a series of scans of the touch sensor array to detect one or more positions of the one or more touches when the touch sensor array is switched to the active scan state.

15. The method of claim 13, further comprising detecting a shape of the one or more touches.

16. A touch sensitive button, comprising:
   touch sensing means for detecting a touch at the button;
   means for placing the touch sensing means in a low-power state when no touch of the button is detected;
   means for switching the touch sensing means from the low-power state to an active scan state when a touch of the button is detected;
   means for detecting input events when the touch sensing means is switched to the active scan state;
   means for identifying an object touching the button; and
   means for generating a control signal when a pressure threshold is exceeded.

17. The touch sensitive button of claim 16, further comprising means for scanning the touch sensing means to detect one or more touches of one or more objects when the touch sensing means is switched to the active scan state.

18. The touch sensitive button of claim 16, further comprising means for initiating an operation when the control signal is generated.

* * * * *